US012094898B2

(12) United States Patent
Lei

(10) Patent No.: US 12,094,898 B2
(45) Date of Patent: Sep. 17, 2024

(54) SEMICONDUCTOR ELEMENT, SEMICONDUCTOR ELEMENT PREPARING METHOD, AND SOLID STATE IMAGING APPARATUS

(71) Applicant: Ningbo ABAX Sensing Electronic Technology Co., Ltd., Ningbo (CN)

(72) Inventor: Shuyu Lei, Ningbo (CN)

(73) Assignee: Ningbo ABAX Sensing Electronic Technology Co., Ltd., Ningbo (CN)

( * ) Notice: Subject to any disclaimer, the term of this patent is extended or adjusted under 35 U.S.C. 154(b) by 429 days.

(21) Appl. No.: 17/613,646

(22) PCT Filed: Oct. 9, 2019

(86) PCT No.: PCT/CN2019/110219
§ 371 (c)(1),
(2) Date: Nov. 23, 2021

(87) PCT Pub. No.: WO2020/237961
PCT Pub. Date: Dec. 3, 2020

(65) Prior Publication Data
US 2022/0238581 A1    Jul. 28, 2022

(30) Foreign Application Priority Data

May 31, 2019  (CN) .......................... 201910473269.4

(51) Int. Cl.
*H01L 27/146*    (2006.01)
(52) U.S. Cl.
CPC .... *H01L 27/14614* (2013.01); *H01L 27/1463* (2013.01); *H01L 27/14638* (2013.01)
(58) Field of Classification Search
None
See application file for complete search history.

(56) References Cited

U.S. PATENT DOCUMENTS 5,581,094 A * 12/1996 Hara ................. H01L 27/14625
257/233
8,860,861 B2 * 10/2014 Aoyama ........... H01L 27/14609
257/431
9,324,758 B2    4/2016 Oh et al.
(Continued)

FOREIGN PATENT DOCUMENTS

CN      102082154 B  *  6/2014   ....... H01L 27/14603
CN      103985721 A      8/2014
(Continued)

OTHER PUBLICATIONS

International Search Report, China National Intellectual Property Administration, Application No. PCT/CN2019/110219, mailed Feb. 25, 2020, 4 pages.

*Primary Examiner* — Scott B Geyer
(74) *Attorney, Agent, or Firm* — Ziegler IP Law Group LLC.

(57) ABSTRACT

A semiconductor element, a semiconductor element preparing method, and a solid state imaging apparatus. The semiconductor element comprises: a group of first modulation grids, a group of second modulation grids, a semiconductor region, a first storage region, and a second storage region. The group of first modulation grids and the group of second modulation grids are respectively provided with different voltages, the potential of a signal charge transfer path in the semiconductor region is changed, and signal charges are controlled to move along a second direction; the first storage region is directly connected to the first modulation grids, so that when the voltage of the first storage region is higher than the voltage of the first modulation grids, and the first storage region attracts first signal charges retained in the first modulation grids.

15 Claims, 3 Drawing Sheets

(56) References Cited

U.S. PATENT DOCUMENTS

| | | |
|---|---|---|
| 9,673,237 B2 | 6/2017 | Kim et al. |
| 10,680,032 B2 | 6/2020 | Kawahito |
| 2005/0145773 A1* | 7/2005 | Hashimoto .............. H03D 9/00 |
| | | 257/E31.115 |
| 2006/0192938 A1 | 8/2006 | Kawahito |
| 2008/0093534 A1* | 4/2008 | Mheen .................. H04N 25/77 |
| | | 257/E27.131 |
| 2009/0134396 A1* | 5/2009 | Kawahito ......... H01L 27/14643 |
| | | 257/225 |
| 2010/0053405 A1* | 3/2010 | Lehmann ......... H01L 27/14609 |
| | | 257/E27.15 |
| 2010/0187401 A1 | 7/2010 | Kawahito |
| 2012/0175685 A1* | 7/2012 | Kim .................. H01L 27/14641 |
| | | 257/225 |
| 2013/0270610 A1* | 10/2013 | Suess ............... H01L 27/14607 |
| | | 438/57 |
| 2016/0163748 A1* | 6/2016 | Sakano ................. H04N 25/59 |
| | | 257/292 |
| 2017/0192090 A1* | 7/2017 | Roy ....................... H04N 25/76 |
| 2017/0237891 A1* | 8/2017 | De Coi .................. H04N 5/265 |
| | | 348/231.99 |
| 2017/0332024 A1* | 11/2017 | Feick ............... H01L 27/14616 |
| 2017/0332029 A1* | 11/2017 | Feick .................... G01S 17/894 |
| 2019/0123078 A1* | 4/2019 | Kobayashi ........... H04N 25/778 |
| 2019/0206915 A1* | 7/2019 | Kawahito ......... H01L 27/14616 |
| 2019/0312158 A1* | 10/2019 | Chen .................... H01L 27/1443 |
| 2020/0029047 A1* | 1/2020 | Jin ....................... H04N 13/254 |
| 2020/0043975 A1* | 2/2020 | Van Der Tempel ........................ |
| | | H01L 27/14856 |
| 2020/0312902 A1* | 10/2020 | Kawahito ............. G01S 7/4914 |
| 2021/0255282 A1* | 8/2021 | Katayama ............. G01S 7/4914 |
| 2022/0238581 A1* | 7/2022 | Lei ....................... H01L 27/146 |

FOREIGN PATENT DOCUMENTS

| | | |
|---|---|---|
| CN | 104051483 B | 6/2018 |
| CN | 109791934 A | 5/2019 |

\* cited by examiner

SEMICONDUCTOR ELEMENT, SEMICONDUCTOR ELEMENT PREPARING METHOD, AND SOLID STATE IMAGING APPARATUS

CROSS REFERENCE TO RELATED APPLICATION

The present application is the national phase of PCT International Application No. PCT/CN2019/110219, which claims priority to Chinese Patent Application No. 201910473269.4, titled "SEMICONDUCTOR ELEMENT, SEMICONDUCTOR ELEMENT PREPARING METHOD, AND SOLID STATE IMAGING APPARATUS", filed on May 31, 2019 with the Chinese Patent Office, which both of which are incorporated herein by reference in their entireties.

FIELD

The present disclosure relates to the field of semiconductors, and in particular to a semiconductor element, a method for manufacturing a semiconductor element, and a solid-state imaging device.

BACKGROUND

With the development of the semiconductor technology and the integrated circuit technology, elements such as transistors, resistors, capacitors and inductors required in a circuit may be interconnected by wiring and are arranged on a small or several small semiconductor wafers, to realize a chip with required circuit functions.

In the conventional technology, a driving circuit, a photoelectric conversion element, an A/D conversion element, and an optical communication unit may be integrated on a chip, to realize a solid-state imaging device with an image acquisition function. Specifically, an object whose image is to be acquired reflects a target light to the solid-state imaging device, and the drive circuit drives the photoelectric conversion element to obtain the target light reflected by the object, i.e., an optical signal. The photoelectric conversion element converts the optical signal into signal charges. The signal charges outputted by the photoelectric conversion element is inputted to the A/D conversion element, and a digital signal is outputted through the A/D conversion element. Next, the digital signal is inputted to the optical communication unit, and the optical signal is outputted through the optical communication unit.

However, it is founded by the inventor of the present disclosure in the process of realizing the above conventional technology that, the photoelectric conversion element in the conventional technology has a low photoelectric conversion efficiency.

SUMMARY

An object of the present disclosure is to provide a semiconductor element, a method for manufacturing a semiconductor element, and a solid-state imaging device, to solve a problem of a low photoelectric conversion efficiency of a photoelectric conversion element.

In order to achieve the above object, a semiconductor element is provided according to an embodiment of the present disclosure. The semiconductor element includes: a first modulation gate group, a second modulation gate group, a semiconductor region; a first storage region; and a second storage region. The first modulation gate group includes at least two first modulation gates. The second modulation gate group includes at least two second modulation gates. The first modulation gate group and the second modulation gate group are respectively arranged on two sides of the semiconductor region, so that in a case that a voltage applied to the first modulation gate group is different from a voltage applied to the second modulation gate group, electric potentials of the two sides of the semiconductor region are changed and signal charges are controlled to move in a second direction, where the second direction includes a movement direction of the signal charges in the semiconductor region. The first storage region is directly connected to each of the first modulation gates, so that in a case that a voltage of the first storage region is higher than the voltage of the first modulation gate, first signal charges remained in the first modulation gate are attracted to the first storage region and are stored in the first storage region. The second storage region is directly connected to each of the second modulation gates, so that in a case that a voltage of the second storage region is higher than the voltage of the second modulation gate, second signal charges remained in the second modulation gate are attracted to the second storage region and are stored in the second storage region.

Further, the first storage region is arranged between adjacent first modulation gates; and/or the second storage region is arranged between adjacent second modulation gates.

Further, the semiconductor region includes a buried layer, and the buried layer is formed by a first type of conductive material. The buried layer is formed on a substrate, and the substrate is formed by a second type of conductive material. Along a first direction, a first buffer region is provided in a region of the buried layer close to the first modulation gate, the first buffer region is formed by the first type of conductive material, and the first direction is perpendicular to the second direction, and a concentration of the first type of conductive material in the first buffer region is greater than a concentration of the first type of conductive material in the buried layer. Along the first direction, a second buffer region is provided in a region of the buried layer close to the second modulation gate, the second buffer region is formed by the first type of conductive material, and a concentration of the first type of conductive material in the second buffer region is greater than the concentration of the first type of conductive material in the buried layer.

Further, the semiconductor element further includes a first sub storage region and a second sub storage region. Along the first direction, the first sub storage region is arranged on a side of the first modulation gate far away from the semiconductor region, a first isolation region is provided between the first buffer region and the first sub storage region, and the first storage region includes the first sub storage region. Along the first direction, the second sub storage region is arranged on a side of the second modulation gate far away from the semiconductor region, a second isolation region is provided between the second buffer region and the second sub storage region, and the second storage region includes the second sub storage region.

Further, the semiconductor element further includes a first output region, a first switch, a second output region and a second switch. Along the second direction, the first switch and the first output region are sequentially arranged on a side of the first storage region far away from the semiconductor region, the first storage region is spaced apart from the first output region by a preset distance, and the first storage region is formed by the first type of conductive material. In a case that the first switch is turned on, the signal charges are outputted via the first output region. Along the second direction, the second switch and the second output region are sequentially arranged on a side of the second storage region far away from the semiconductor region, the second storage region is spaced apart from the second output region by a preset distance, and the second storage region is formed by the first type of conductive material. In a case that the second switch is turned on, the signal charges are outputted via the second output region.

Further, the semiconductor element further includes a third switch, a third output region, a fourth switch and a fourth output region. The third output region and the fourth output region are respectively arranged on two sides of the semiconductor region along the first direction, the third switch is arranged between the semiconductor region and the third output region, and the fourth switch is arranged between the semiconductor region and the fourth output region. In a case that the third switch is turned on, non-signal charges are outputted via the third output region. In a case that the fourth switch is turned on, non-signal charges are outputted via the fourth output region, where the non-signal charges include charges that are not the signal charges in the semiconductor region.

Further, the semiconductor element further includes at least one third modulation gate group. The third modulation gate group includes at least two third modulation gates. The third modulation gate group is arranged between the first modulation gate group and the second modulation gate group.

A solid-state imaging device is further provided according to an embodiment of the present disclosure. The solid-state imaging device includes the semiconductor element as described above, where the signal charges include charges converted by a signal light.

A method for manufacturing a semiconductor element is further provided according to an embodiment of the present disclosure. The method includes:
  arranging a first modulation gate group and a second modulation gate group respectively on two sides of a semiconductor region, so that in a case that a voltage applied to the first modulation gate group is different from a voltage applied to the second modulation gate group, an electric potential of a signal charge transfer path in the semiconductor region is changed and signal charges are controlled to move in a second direction, where the second direction includes a movement direction of the signal charges in the semiconductor region;
  connecting a first storage region directly to a first modulation gate, so that in a case that a voltage of the first storage region is higher than a voltage of the first modulation gate, the first storage region attracts first signal charges remained in the first modulation gate; and
  connecting a second storage region directly to a second modulation gate, so that in a case that a voltage of the second storage region is higher than the voltage of the second modulation gate, the second storage region attracts second signal charges remained in the second modulation gate.

Further, the method further includes:
  arranging the first storage region between adjacent first modulation gates; and/or
  arranging the second storage region between adjacent second modulation gates.

Further, the semiconductor region includes a buried layer formed by a first type of conductive material, and the method further includes:
  arranging the buried layer on a substrate, where the substrate is formed by a second type of conductive material;
  along a first direction, arranging a first buffer region in a region of the buried layer close to the first modulation gate, where the first buffer region is formed by the first type of conductive material, and the first direction is perpendicular to the second direction, and a concentration of the first type of conductive material in the first buffer region is greater than a concentration of the first type of conductive material in the buried layer; and
  along the first direction, arranging a second buffer region in a region of the buried layer close to the second modulation gate, where the second buffer region is formed by the first type of conductive material, and a concentration of the first type of conductive material in the second buffer region is greater than the concentration of the first type of conductive material in the buried layer.

Further, the method further includes:
  along the first direction, arranging a first sub storage region on a side of the first modulation gate far away from the semiconductor region, and arranging a first isolation region between the first buffer region and the first sub storage region, where the first storage region includes the first sub storage region; and
  along the first direction, arranging a second sub storage region on a side of the second modulation gate far away from the semiconductor region, and arranging a second isolation region between the second buffer region and the second sub storage region, where the second storage region includes the second sub storage region.

Further, the method further includes:
  along the second direction, arranging a first switch and a first output region sequentially on a side of the first storage region far away from the semiconductor region, where the first storage region is arranged on a side of the buried layer close to the first switch, the first storage region is spaced apart from the first output region by a preset distance, the first storage region is formed by the first type of conductive material, and in a case that the first switch is turned on, the signal charges are outputted via the first output region; and
  along the second direction, arranging a second switch and a second output region sequentially on a side of the second storage region far away from the semiconductor region, where the second storage region is arranged on a side of the buried layer close to the second switch, the first storage region is spaced apart from the first output region by a preset distance, the first storage region is formed by the first type of conductive material, and in a case that the first switch is turned on, the signal charges are outputted via the first output region.

Further, the method further includes: arranging a third switch and a fourth switch respectively on two sides of the semiconductor region along the first direction, to output non-signal charges, where the non-signal charges include charges that are not the signal charges.

Further, the method further includes: arranging at least one third modulation gate group between the first modulation gate group and the second modulation gate group, where the third modulation gate group includes at least two third modulation gates respectively arranged adjacent to each other.

According to the embodiments of the present disclosure, a semiconductor element, a method for manufacturing a semiconductor element, and a solid-state imaging device are provided. The semiconductor element includes: a first modulation gate group, a second modulation gate group, a semiconductor region, a first storage region, and a second storage region. The first modulation gate group includes at least two first modulation gates, and the second modulation gate group includes at least two second modulation gates. The first modulation gate group and the second modulation gate group are respectively arranged on two sides of the semiconductor region. Different voltages are respectively applied to the first modulation gate group and the second modulation gate group, to change an electric potential of a signal charge transfer path in the semiconductor region and control signal charges to move in a second direction in a range of a first direction, where the second direction includes a movement direction of the signal charges in the semiconductor region, and the first direction is perpendicular to the second direction. The range of the first direction includes: a range of a distance between the first modulation gates in the first direction, or a range of a distance between the second modulation gates in the first direction. The first storage region is directly connected to the first modulation gate, so that in a case that a voltage of the first storage region is higher than the voltage of the first modulation gate, the first storage region attracts first signal charges remained in the first modulation gate. The second storage region is directly connected to the second modulation gate, so that in a case that a voltage of the second storage region is higher than the voltage of the second modulation gate, the second storage region attracts second signal charges remained in the second modulation gate. The signal charges include at least the first signal charges and the second signal charges. By directly connecting the second storage region with the second modulation gate and directly connecting the first storage region with the first modulation gate, the first signal charges remained in the first modulation gate can be attracted by the first storage region, the second signal charges remained in the second modulation gate can be attracted by the second storage region, preventing the signal charges remained in the first modulation gate or the second modulation gate from being transferred back to the semiconductor region, thereby improving the accuracy of the next signal charge output.

Other features and advantages of the present disclosure are described in detail in the following specific embodiments.

BRIEF DESCRIPTION OF THE DRAWINGS

The accompanying drawings are given to provide a further understanding for the present disclosure and form a part of this specification. The accompanying drawings together with the following embodiments are used to explain the present disclosure, and do not constitute a limitation to the present disclosure. In the accompanying drawings.

DETAILED DESCRIPTION OF EMBODIMENTS

Exemplary embodiments are described in detail hereafter, and examples thereof are shown in the accompanying drawings. In the following description related to the accompanying drawings, the same number in different drawings indicates the same or similar elements unless otherwise indicated. Implementations described in the following exemplary embodiments do not represent all implementations consistent with the present disclosure, and merely show examples of devices and methods consistent with some aspects of the present disclosure as detailed in the appended claims.

Figure 1:
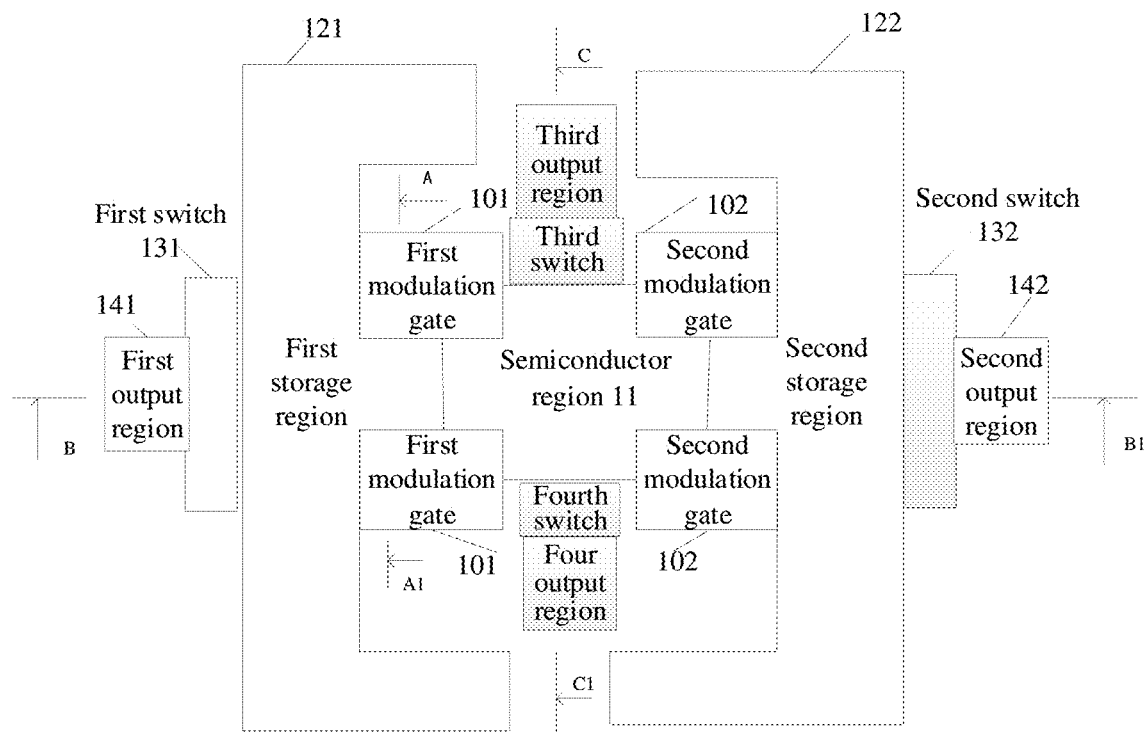
FIG. 1 is a schematic structural diagram of a semiconductor element according to an embodiment of the present disclosure.

FIG. 1 is a schematic structural diagram of a semiconductor element according to an embodiment of the present disclosure. As shown in FIG. 1, the semiconductor element includes: a first modulation gate group, a second modulation gate group, a semiconductor region 11, a first storage region 121 and a second storage region 122. The first modulation gate group includes at least two first modulation gates 101. The second modulation gate group includes at least two second modulation gates 102.

The first modulation gate group and the second modulation gate group are respectively arranged on two sides of the semiconductor region 11, so that in a case that a voltage applied to the first modulation gate group is different from a voltage applied to the second modulation gate group, electric potentials of the two sides of the semiconductor region 11 are changed and signal charges are controlled to move in a second direction. The second direction includes a movement direction of the signal charges in the semiconductor region 11. By setting the voltage applied to the first modulation gate group and the voltage applied to the second modulation gate group, the signal charges are controlled to not only move in the second direction but also move in the second direction in a range of the first direction. The first direction is perpendicular to the second direction. The range of the first direction includes: a range of a distance between the first modulation gates in the first direction, or a range of a distance between the second modulation gates in the first direction.

The first storage region 121 is directly connected to the first modulation gate 101, so that in a case that a voltage of the first storage region 121 is higher than the voltage of the first modulation gate 101, first signal charges remained in the first modulation gate 101 are attracted to the first storage region 121 and are stored in the first storage region 121.

The second storage region 122 is directly connected to the second modulation gate 102, so that in a case that a voltage of the second storage region 122 is higher than the voltage of the second modulation gate 102, second signal charges remained in the second modulation gate 102 are attracted to the second storage region 122 and are stored in the second storage region 122.

The signal charges include at least the first signal charges and/or the second signal charges.

In this embodiment, both the first modulation gate 101 and the second modulation gate 102 are made of metal.

The process of arranging the first modulation gate group and the second modulation gate group on the semiconductor region 11 is implemented by performing the following processes.

The number of first modulation gates 101 arranged in the semiconductor region 11 in the first direction is related to a width of the semiconductor region 11 in the first direction and the voltage applied to the first modulation gate 101, that is, a width between two adjacent first modulation gates 101 in the first modulation gate group is proportional to the voltage applied to the first modulation gate 101. For example, in a case that a voltage of 1V is applied to each of the two adjacent first modulation gates 101, the width between the two adjacent first modulation gates 101 is less than or equal to 2 microns. In addition, in a case that a voltage of 2V is applied to each of the two adjacent first modulation gates 101, the width between the two adjacent first modulation gates 101 may be greater than 2 microns. The process of arranging the second modulation gates 102 on the semiconductor region 11 in the first direction is similar to the process of arranging the first modulation gates 101 described above, which is not repeated herein.

Specifically, the number of first modulation gates 101 included in the first modulation gate group in the semiconductor element and the number of second modulation gates 102 included in the second modulation gate group in the semiconductor element are set as described above. Therefore, in a case that the width in the first direction of the semiconductor region 11 is relatively large and the voltage applied to each first modulation gate 101 is relatively small, multiple first modulation gates 101 may be provided, or in a case that the width in the first direction of the semiconductor region 11 is relatively large and the voltage applied to each second modulation gate 102 is relatively small, multiple second modulation gates 102 may be provided. In the semiconductor element as shown in FIG. 1, the first modulation gate group includes four first modulation gates 101, and the second modulation gate group includes four second modulation gates 102. The four first modulation gates 101 are equally spaced on one side of the semiconductor region 11, and the four second modulation gates 102 are equally spaced on the other side of the semiconductor region 11, so that electrodes for controlling the signal charges are uniformly provided on two sides of the semiconductor region 11. In this way, the signal charges in the semiconductor region are controlled to be stored in a distance range between two adjacent first modulation gates 101 or a distance range between two adjacent first modulation gates 101, thereby implementing an effective and rapid transfer of the signal charges in a direction from the first modulation gates 101 to the second modulation gates 102.

It should be noted that the number of first modulation gates 101 included in the first modulation gate group in the semiconductor element may be the same as or different from the number of second modulation gates 102 included in the second modulation gate group.

Specifically, when signal charges are generated in the semiconductor region 11, different voltages may be respectively applied to the first modulation gate 101 and the second modulation gate 102. In a case that the voltage applied to the first modulation gate 101 is higher than the voltage applied to the second modulation gate 102, the signal charges stored in the semiconductor region 11 move from a side where the second modulation gate 102 is located to a side where the first modulation gate 101 is located. It should be noted that, in a process that the signal charges move via a buried layer from the side where the second modulation electrode 102 is located to the side where the first modulation gate 101 is located, a small part of the signal charges move inside the first modulation gate 101. When no voltage is applied to the first modulation gate 101 or the voltage applied to the first modulation gate 101 is lower than the voltage applied to the second modulation gate 102, the signal charges moving inside the first modulation gate 101 move back to the semiconductor region 11 from the first modulation gate 101. In order to reduce an effect of this phenomenon on an accuracy of a next signal charge output, the voltage of the first storage region 121 is set to be higher than the voltage of the first modulation gate 101 when directly connecting the first storage region 121 to the first modulation gate 101 and setting a negative voltage for the first modulation gate 101, so that the first storage region 121 attracts the signal charges remained in the first modulation gate 101, preventing the signal charges remained in the first modulation gate 101 from being transferred back to the semiconductor region 11, thereby ensuring the accuracy of the next signal charge output. Similarly, the signal charges moving inside the second modulation gate 102 may move out of the second modulation gate 102 to the semiconductor region 11. In order to reduce the effect of this phenomenon on the accuracy of the next signal charge output, the voltage of the second storage region 122 is set to be higher than the voltage of the second modulation gate 102 when directly connecting the second storage region 122 to the second modulation gate 102 and setting a negative voltage for the second modulation gate 102, so that the second storage region 122 attracts the signal charges remained in the second modulation gate 102.

In this embodiment, the semiconductor element includes: a first modulation gate group, a second modulation gate group, a semiconductor region, a first storage region, and a second storage region. The first modulation gate group includes at least two first modulation gates, and the second modulation gate group includes at least two second modulation gates. The first modulation gate group and the second modulation gate group are respectively arranged on two sides of the semiconductor region. Different voltages are respectively applied to the first modulation gate group and the second modulation gate group, to change an electric potential of a signal charge transfer path in the semiconductor region and control signal charges to move in a second direction in a range of a first direction, where the second direction includes a movement direction of the signal charges in the semiconductor region, and the first direction is perpendicular to the second direction. The range of the first direction includes: a range of a distance between the first modulation gates in the first direction, or a range of a distance between the second modulation gates in the first direction. The first storage region is directly connected to the first modulation gate, so that in a case that a voltage of the first storage region is higher than the voltage of the first modulation gate, the first storage region attracts first signal charges remained in the first modulation gate. The second storage region is directly connected to the second modulation gate, so that in a case that a voltage of the second storage region is higher than the voltage of the second modulation gate, the second storage region attracts second signal charges remained in the second modulation gate. The signal charges include at least the first signal charges and the second signal charges. By directly connecting the second storage region with the second modulation gate and directly connecting the first storage region with the first modulation gate, the first signal charges remained in the first modulation gate can be attracted by the first storage region, the second signal charges remained in the second modulation gate can be attracted by the second storage region, preventing the signal charges remained in the first modulation gate or the second modulation gate from being transferred back to the semiconductor region, thereby improving the accuracy of the next signal charge output.

Preferably, based on the above embodiments, the first storage region 121 is arranged between the adjacent first modulation gates 101; and/or the second storage region 122 is arranged between the adjacent second modulation gates 102.

The first storage region 121 and the second storage region 122 in this embodiment are each formed by a first type of conductive material.

In this embodiment, by arranging the first storage region 121 between the adjacent first modulation gates 101, a contact region between the first modulation gate 101 and the first storage region 121 is increased, improving an efficiency of the first storage region 121 in attracting the first signal charges remained in the first modulation gate 101. Further, by arranging the second storage region 122 between the adjacent second modulation gates 102, a contact region between the first modulation gate 101 and the first storage region 121 is increased, improving an efficiency of the second storage region 122 in attracting the second signal charges remained in the second modulation gate 102. In this way, the first signal charges and the second signal charges can be prevented from flowing back to the semiconductor region.

Based on the above embodiments, along the second direction, a first switch 131 and a first output region 141 are sequentially arranged on a side of the first storage region 121 far away from the semiconductor region 11. In a case that the first switch is turned on, the signal charges are outputted via the first output region.

Along the second direction, a second switch 132 and a second output region 142 are sequentially arranged on a side of the second storage region 122 far away from the semiconductor region 11. In a case that the second switch is turned on, the signal charges are outputted via the second output region.

Specifically, the first switch is turned on or turned off by applying or not applying a voltage to the first switch. In the case that the first switch is turned on, the signal charges stored in the first storage region are outputted via the first output region. Further, the second switch is turned on or turned off by applying or not applying a voltage to the second switch. In the case that the second switch is turned on, the signal charges stored in the second storage region are outputted via the second output region.

Figure 2:
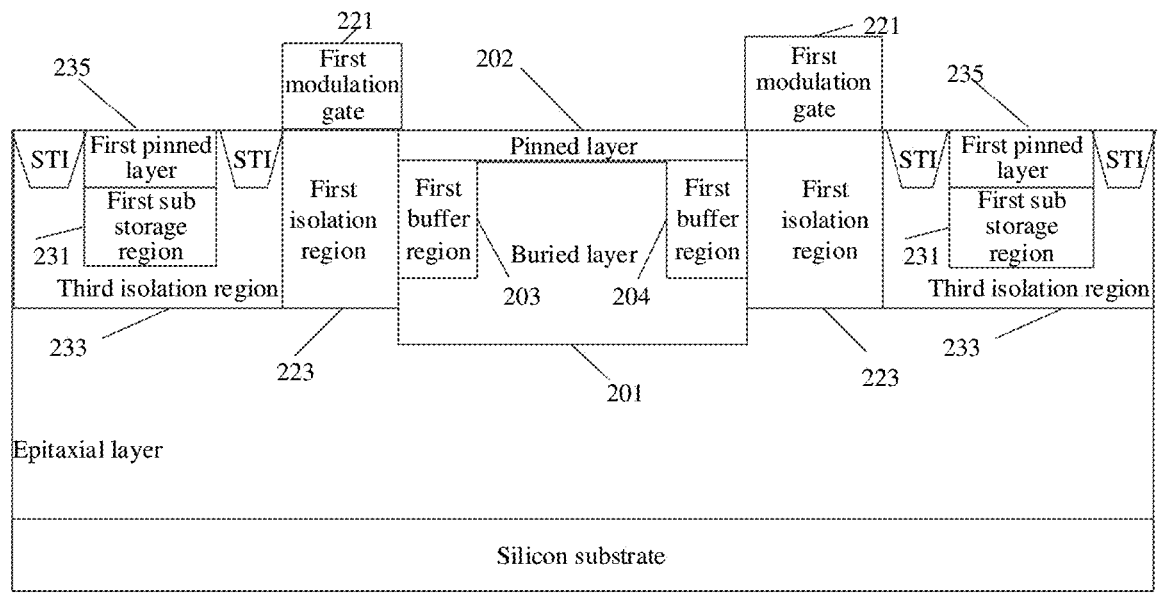
FIG. 2 is a schematic diagram of a sectional structure of the semiconductor element according to the embodiment of the present disclosure.

FIG. 2 is a schematic diagram of a sectional structure of the semiconductor element according to the embodiment of the present disclosure. As shown in FIG. 2, this schematic diagram shows a sectional structure of the semiconductor element shown in FIG. 1 taken along a direction of A-A1. Based on the above embodiments, the semiconductor region includes a buried layer 201. The buried layer 201 is formed by the first type of conductive material.

The buried layer 201 is formed on an epitaxial layer. The epitaxial layer is formed by a second type of conductive material. Specifically, the epitaxial layer is arranged on a silicon substrate, and the epitaxial layer may be obtained by doping with the second type of conductive material through an epitaxial process. After the epitaxial layer is formed, the buried layer 201 is formed on the epitaxial layer.

Along the first direction, a first buffer region 203 is provided in a region of the buried layer 201 close to the first modulation gate 221, where the first direction is perpendicular to the second direction. The first buffer region 203 is formed by the first type of conductive material. A concentration of the first type of conductive material in the first buffer region 203 is greater than a concentration of the first type of conductive material in the buried layer 201.

Along the first direction, a second buffer region is provided in a region of the buried layer 201 close to the second modulation gate. The second buffer region is formed by the first type of conductive material. A concentration of the first type of conductive material in the second buffer region is greater than a concentration of the first type of conductive material in the buried layer 201.

It should be noted that, the first buffer region 203 may be provided on one side or two sides of the region of the buried layer 201 close to the first modulation gate 221.

The second buffer region may be provided on one side or two sides of the region of the buried layer 201 close to the second modulation gate.

Specifically, in a process that the signal charges move through the buried region from a side where the second modulation gate is located to a side where the first modulation gate 221 is located, a small part of the signal charges, i.e., the first sub signal charges move inside the first modulation gate 221. In a case that no voltage is applied to the first modulation gate 221 or the voltage applied to the first modulation gate 221 is lower than the voltage applied to the second modulation gate, the first sub signal charges moving inside the first modulation gate 221 move back to the semiconductor region from the first modulation gate 221. In this case, the first buffer region 203 is provided in the region of the buried layer 201 close to the first modulation gate 221, to prevent the first sub signal charges from moving back to the semiconductor region. In addition, in a process that the signal charges move through the buried region from a side where the first modulation gate 221 is located to a side where the second modulation gate is located, a small part of the signal charges, i.e., the second sub signal charges move inside the second modulation gate. In a case that no voltage is applied to the second modulation gate or the voltage applied to the second modulation gate is lower than the voltage applied to the first modulation gate 221, the second sub signal charges moving inside the second modulation gate move back to the semiconductor region from the second modulation gate. In this case, the second buffer region is provided in the region of the buried layer 201 close to the second modulation gate, to prevent the second sub signal charges from moving back to the semiconductor region.

Further, based on the above embodiments, the semiconductor element according to the embodiment of the present disclosure further includes: a first sub storage region and a second sub storage region.

Along the first direction, the first sub storage region 231 is arranged on a side of the first modulation gate 221 far away from the semiconductor region. A first isolation region 223 is provided between the first buffer region 203 and the first sub storage region 231. The first storage region includes the first sub storage region 231.

Along the first direction, the second sub storage region is provided on a side of the second modulation gate far away from the semiconductor region. A second isolation region is provided between the second buffer region and the second sub storage region. The second storage region includes the second sub storage region.

The first storage region in this embodiment has a relatively large area. In this case, a part of the first storage region, for example, the first sub storage region 231 is arranged near the first modulation gate 221, and the first isolation region 223 is arranged between the first sub storage region and the semiconductor region to avoid a turn-on voltage of the first modulation gate 221. Further, the second storage region has a relatively large area. In this case, a part of the second storage region, for example, the second sub storage region is arranged near the second modulation gate, and the second isolation region is arranged between the second sub storage region and the semiconductor region to avoid a turn-on voltage of the second modulation gate.

In the semiconductor element according to this embodiment, the semiconductor region further includes: a pinned layer 202 and the buried layer 201. Further, the first buffer region 203 and the second buffer region 204 are respectively arranged on the left and right sides of the buried layer 201. An isolation layer is provided in a region adjacent to the left and right sides of the upper surface of the pinned layer, and the isolation layer is not shown in FIG. 2. Metal gates are provided above the isolation layer, that is, the first modulation gate 221 and the second modulation gate. Further, the sub storage region 231 and the second sub storage region are respectively arranged on the left and right sides of the semiconductor region. A third isolation region 233 is provided between the first sub storage region 231 and the substrate to prevent the signal charges stored in the first sub storage region 231 from entering the substrate, where the third isolation region 233 is formed by the second type of conductive material. In addition, a fourth isolation region is provided between the second sub storage region and the substrate to prevent the signal charges stored in the second sub storage region from entering the substrate, where the fourth isolation region is formed by the second type of conductive material. The first isolation region 223 is arranged between the first buffer region 203 and the first sub storage region 231. The second isolation region is arranged between the second buffer region 204 and the second sub storage region, where the second isolation region is formed by the second type of conductive material. An isolation layer ST1 is formed in the third isolation region 233, and an isolation layer ST1 is formed in the fourth isolation region. Further, a first pinned layer 235 for isolation may be provided on the top of the first sub storage region 231, and a second pinned layer for isolation may be provided on the top of the second sub storage region.

The semiconductor element operates in the following manner. When signal charges are stored in the buried layer 201, different voltages may be respectively applied to the first modulation gate 221 and the second modulation gate. In a case that the voltage applied to the first modulation gate 221 is higher than the voltage applied to the second modulation gate, the signal charges stored in the buried layer 201 move via a buried region from a side where the second modulation gate is located to a side where the first modulation gate 221 is located. It should be noted that, in a process that the signal charges in the buried region move from the side where the second modulation gate is located to the side where the first modulation gate 221 is located, a small part of the signal charges move inside the first modulation gate 221. Then, when no voltage is applied to the metal gate, i.e., the first modulation gate 221 or the voltage applied to the first modulation gate 221 is lower than the voltage applied to the second modulation gate, the signal charges moving inside the first modulation gate 221 move to the buried region from the first modulation gate 221. In order to reduce an effect of this phenomenon on the accuracy of the next photoelectric conversion, the first storage region and the second storage region are respectively arranged on the left and right sides of the buried layer 201, to store the signal charges moved from the first modulation gate 221.

Figure 3:
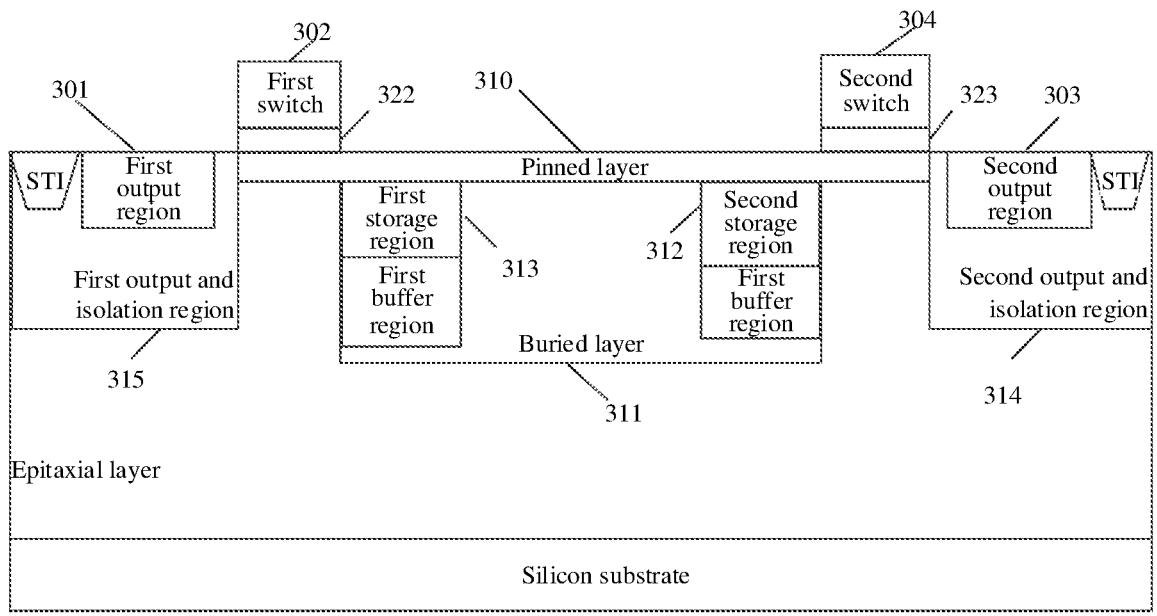
FIG. 3 is a schematic diagram of a sectional structure of a semiconductor element according to another embodiment of the present disclosure.

FIG. 3 is a schematic diagram of a sectional structure of a semiconductor element according to another embodiment of the present disclosure. As shown in FIG. 3, this schematic diagram shows a sectional structure of the semiconductor element shown in FIG. 1 taken along a direction of B-B1. Based on the above embodiments, the semiconductor element further includes: a first output region 301, a first switch 302, a second output region 303, and a second switch 304.

Along the second direction, the first switch 302 and the first output region 301 are sequentially arranged on a side of the first storage region 313 far away from the semiconductor region. In a case that the first switch 302 is turned on, the signal charges are outputted via the first output region 301.

Along the second direction, the second switch 304 and the second output region 303 are sequentially arranged on a side of the second storage region 312 far away from the semiconductor region. In a case that the second switch 304 is turned on, the signal charges are output from the second output region 303.

Preferably, based on the above embodiments, the first storage region 313 is arranged on a side of the buried layer 311 close to the first switch 302, and the first storage region 313 is spaced apart from the first output region 301 by a preset distance. The first storage region 313 is formed by the first type of conductive material.

The second storage region 312 is arranged on a side of the buried layer 311 close to the second switch 304, and the second storage region 312 is spaced apart from the second output region 303 by a preset distance. The second storage region 312 is formed by the first type of conductive material.

Specifically, the semiconductor region includes a buried layer 311. A pinned layer 310 may be provided on the buried layer 311. The pinned layer 310 has a larger area than the buried layer 311. The buried layer 311 is formed by the first type of conductive material. The pinned layer is formed by the second type of conductive material. A first isolation layer 322 and a second isolation layer 323 are respectively provided at positions adjacent to two sides of the upper surface of the pinned layer. A polysilicon layer is provided above the first isolation layer and the second isolation layer to form the first switch 302 and the second switch 304. Isolation regions are respectively provided on two sides of the buried layer, where the isolation regions are each formed by the first type of conductive material. The pinned layer is connected to the isolation region. The first storage region 313 is spaced apart from the first output region 301 by a preset distance. Further, the second storage region 312 is spaced apart from the second output region 303 by a preset distance. In addition, a sub isolation region ST1 is provided in the isolation region.

It should be noted that, the first storage region 313 is spaced apart from the first output region 301 by the preset distance, and the second storage region 312 is spaced apart from the second output region 303 by the preset distance. In this way, signal charges stored in the first storage region 313 can be prevented from being directly outputted through the first output region 301, so that the signal charges stored in the first storage region 313 can be adjusted through the first switch 302. Further, signal charges stored in the second storage region 312 can be prevented from being directly outputted through the second output region 303, so that the signal charges stored in the second storage region 312 can be adjusted through the second switch 304.

In the semiconductor element according to this embodiment, the semiconductor region includes a pinned layer and a buried layer. The pinned layer is provided on the buried layer, and the pinned layer has a larger area than the buried layer. A first output and isolation region 315 and a second output and isolation region 314 are respectively provided at positions adjacent to the left and right sides of the upper surface of the pinned layer. The pinned layer is connected to the first output and isolation region 315 and the second output and isolation region 314 located on two sides thereof. The first output and isolation region 315 and the second output and isolation region 314 are each formed by the second type of conductive material. A first output region 301 is provided in the first output and isolation region 315 near the buried layer, and a second output region 303 is provided in the second output and isolation region 314 near the buried layer. A first storage region 313 and a second storage region 312 are respectively provided on the left and right sides of the buried layer. The buried layer, the first storage region 313 and the second storage region 312 are each formed by the first type of conductive material. A concentration of the first type of conductive material in the first storage region 313 and a concentration of the first type of conductive material in the second storage region 312 are each greater than a concentration of the first type of conductive material in the buried layer. It should be noted that, a gap is formed between the first storage region 313 and the first output and isolation region 315 to prevent signal charges stored in the first storage region 313 from being directly outputted through the first output region 301, so that the signal charges stored in the first storage region 313 can be adjusted through the first switch 302. Further, a gap is formed between the second storage region 312 and the second output and isolation region 314 to prevent signal charges stored in the second storage region 312 from being directly outputted through the second output region 303, so that the signal charges stored in the first storage region 313 can be adjusted through the first switch 302. Furthermore, in the first output and isolation region 315, an isolation region ST1 is provided at a position spaced apart from the first output region 301 by a certain distance. In the second output and isolation region 314, an isolation region ST1 is provided at a position spaced apart from the second output region 303 by a certain distance. Moreover, a first isolation layer 322 and a second isolation layer 323 are respectively provided at positions adjacent to two sides of the upper surface of the pinned layer. A first switch 302 is provided above the first isolation layer 322, and a second switch 304 is provided above the second isolation layer 323. The first switch 302 and the second switch 304 may be each implemented by a metal gate. The first isolation layer 322 and the second isolation layer 323 may be made of silicon oxide. Further, in order to prevent the signal charges from moving out of the first storage region and the second storage region, a first sub isolation region and a second sub isolation region are respectively provided under the first storage region and the second storage region. The first sub isolation region and the second sub isolation region are each formed by a large amount of the second type of conductive material.

Figure 4:
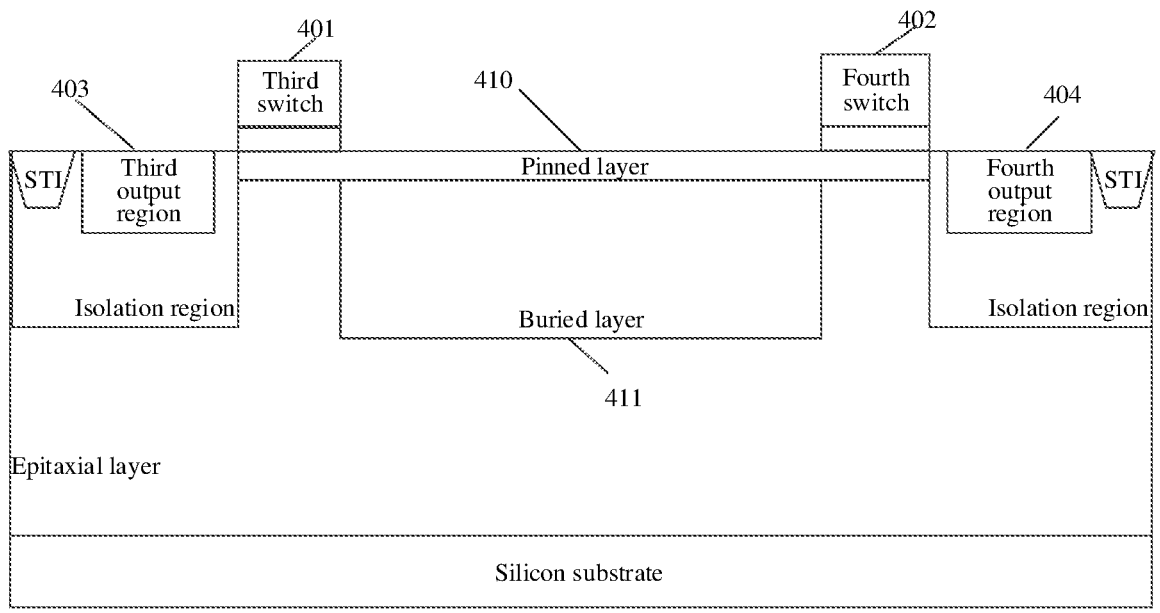
FIG. 4 is a schematic diagram of a sectional structure of a semiconductor element according to another embodiment of the present disclosure.

FIG. 4 is a schematic diagram of a sectional structure of a semiconductor element according to another embodiment of the present disclosure. As shown in FIG. 4, this schematic diagram shows a sectional structure of the semiconductor element shown in FIG. 1 taken along a direction of C-C1. Based on the above embodiments, the semiconductor element further includes: a third switch 401 and a fourth switch 402.

A third output region 403 and a fourth output region 404 are respectively provided on two sides of the semiconductor region along the first direction. The third switch 401 is arranged between the semiconductor region and the third output region 403. The fourth switch 402 is arranged between the semiconductor region and the fourth output region 404. In a case that the third switch 401 is turned on, non-signal charges are outputted via the third output region 403. In a case that the fourth switch 402 is turned on, non-signal charges are outputted via the fourth output region 404. The non-signal charges include charges that are not the signal charges in the semiconductor region.

In this embodiment, the signal charges are charges generated by a target light reflected by a target object to the semiconductor element, and the non-signal charges may be charges generated by a background light entering the semiconductor element, where any light that is not the target light may form the background light.

For example, before the target light enters the semiconductor element, the third switch 401 and the fourth switch 402 may be respectively applied with voltages, to remove the non-signal charges generated by the background light from the semiconductor element, thereby accurately processing the signal charges.

Specifically, the semiconductor region includes a pinned layer 410 and a buried layer 411. The pinned layer 410 has a larger area than the buried layer 411. Further, an isolation layer is provided in regions adjacent to the left and right sides of the upper surface of the pinned layer 410. A polysilicon layer is provided above the isolation layer. That is, the third switch 401 and the fourth switch 402. Isolation regions are respectively provided on the left and right sides of the pinned layer 410, and the pinned layer 410 is connected to the isolation regions. The third output region 403 and the fourth output region 404 are respectively provided in the isolation regions which are respectively located on the left and right sides of the pinned layer 410.

Figure 5:
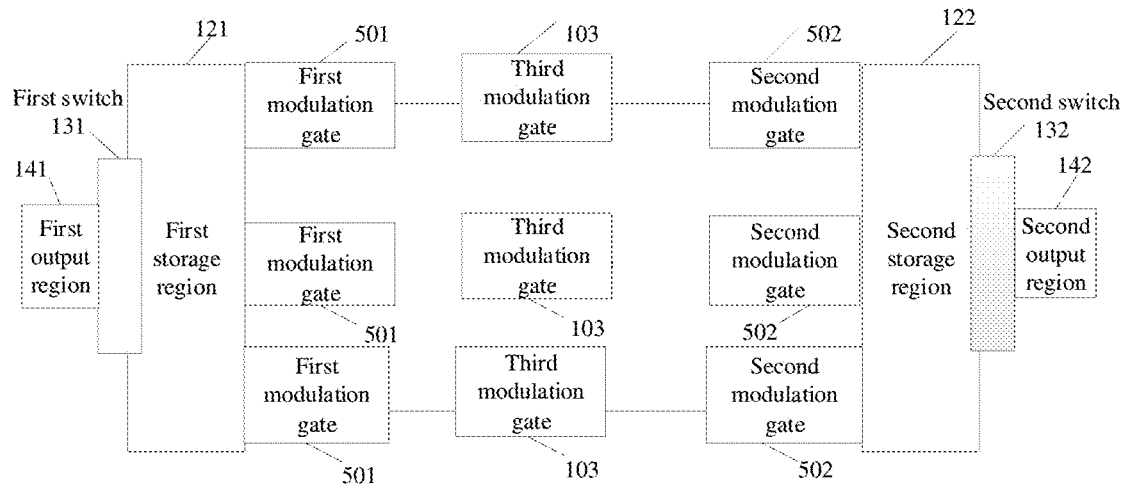
FIG. 5 is a schematic diagram of a sectional structure of a semiconductor element according to another embodiment of the present disclosure.

FIG. 5 is a schematic diagram of a sectional structure of a semiconductor element according to another embodiment of the present disclosure. As shown in FIG. 5, based on the above embodiments, the semiconductor element according to this embodiment further includes at least one third modulation gate group. The third modulation gate group includes at least two third modulation gates 103.

In a case that the semiconductor element includes one third modulation gate group, the third modulation gate group is arranged between the first modulation gate group and the second modulation gate group, where the first modulation gate group includes at least two first modulation gates 501, and the second modulation gate group includes at least two second modulation gates 502.

In a case that the semiconductor element includes at least two third modulation gate groups, the third modulation gate groups are adjacently arranged between the first modulation gate group and the second modulation gate group.

In this embodiment, for a case that the semiconductor region has a relatively large area, at least one third modulation gate group may be provided between the first modulation gate group and the second modulation gate group along the first direction of the semiconductor region, to apply a voltage to the middle part of the semiconductor region, to further avoid that the signal charges cannot transferred from the first modulation gate to the second modulation gate or from the first modulation gate to the second modulation gate due to no effect of the electric potential field in the middle part of the semiconductor region, thereby improving the charge transfer efficiency of the semiconductor element.

A solid-state imaging device is further provided according to an embodiment of the present disclosure. The solid-state imaging device includes the semiconductor element as shown in any one of FIG. 1 to FIG. 4, where the signal charges include charges converted by a signal light, and the signal light corresponds to the target light.

In this embodiment, when the external target light irradiates the semiconductor region, photons of the target light can penetrate to the substrate, i.e., the epitaxial layer region. Signal charges are generated in the epitaxial layer region. The buried layer attracts the signal charges, so that the signal charges generated in the epitaxial layer region are stored in the buried layer. Further, the signal charges stored in the buried layer can be controlled to move by means of the voltages respectively applied to the first modulation gate and the second modulation gate, which is implemented in a manner similar to the above embodiments and is not repeated herein.

Figure 6:
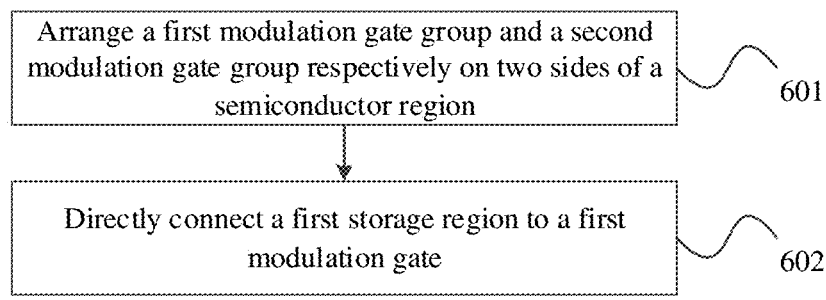
FIG. 6 is a schematic flowchart showing a method for manufacturing a semiconductor element according to another embodiment of the present disclosure.

FIG. 6 is a schematic flowchart showing a method for manufacturing a semiconductor element according to an embodiment of the present disclosure. As shown in FIG. 6, the method for manufacturing a semiconductor element in this embodiment includes the following steps 601 and 602.

In step 601, a first modulation gate group and a second modulation gate group are respectively arranged on two sides of a semiconductor region.

In this embodiment, the first modulation gate group and the second modulation gate group are respectively arranged on two sides of the semiconductor region, so that in a case that a voltage applied to the first modulation gate group is different from a voltage applied to the second modulation gate group, an electric potential of a signal charge transfer path in the semiconductor region is changed, and signal charges are controlled to move in a second direction. The second direction includes a movement direction of the signal charges in the semiconductor region.

In step 602, a first storage region is directly connected to the first modulation gate.

In this embodiment, the first storage region is directly connected to the first modulation gate, so that in a case that a voltage of the first storage region is higher than the voltage of the first modulation gate, the first storage region attracts first signal charges remained in the first modulation gate. Further, a second storage region is directly connected to the second modulation gate, so that in a case that a voltage of the second storage region is higher than the voltage of the second modulation gate, the second storage region attracts second signal charges remained in the second modulation gate.

The signal charges in this embodiment at least include the first signal charges and/or the second signal charges.

Both the first modulation gate and the second modulation gate in this embodiment are made of metal.

The process of arranging the first modulation gate group and the second modulation gate group on the semiconductor region is implemented by performing the following processes.

The number of first modulation gates arranged in the semiconductor region in the first direction is related to a width of the semiconductor region in the first direction and the voltage applied to the first modulation gate, that is, a width between two adjacent first modulation gates in the first modulation gate group is proportional to the voltage applied to the first modulation gate. For example, in a case that a voltage of 1V is applied to each of the two adjacent first modulation gates, the width between the two adjacent first modulation gates is less than or equal to 2 microns. In addition, in a case that a voltage of 2V is applied to each of the two adjacent first modulation gates, the width between the two adjacent first modulation gates may be greater than 2 microns. The process of arranging the second modulation gates on the semiconductor region in the first direction is similar to the process of arranging the first modulation gates described above, which is not repeated herein.

Specifically, the number of first modulation gates included in the first modulation gate group in the semiconductor element and the number of second modulation gates included in the second modulation gate group in the semiconductor element are set as described above. Therefore, in a case that the width in the first direction of the semiconductor region is relatively large and the voltage applied to each first modulation gate is relatively small, multiple first modulation gates may be provided, or in a case that the width in the first direction of the semiconductor region is relatively large and the voltage applied to each second modulation gate is relatively small, multiple second modulation gates may be provided. In the semiconductor element as shown in FIG. 1, the first modulation gate group includes four first modulation gates, and the second modulation gate group includes four second modulation gates. The four first modulation gates are equally spaced on one side of the semiconductor region, and the four second modulation gates are equally spaced on the other side of the semiconductor region, so that electrodes for controlling the signal charges are uniformly provided on two sides of the semiconductor region. In this way, the signal charges in the semiconductor region are controlled to be stored in a distance range between two adjacent first modulation gates or a distance range between two adjacent first modulation gates, thereby implementing an effective and rapid transfer of the signal charges in a direction from the first modulation gates to the second modulation gates.

It should be noted that the number of first modulation gates included in the first modulation gate group in the semiconductor element may be the same as or different from the number of second modulation gates included in the second modulation gate group.

Specifically, when signal charges are generated in the semiconductor region, different voltages may be respectively applied to the first modulation gate and the second modulation gate. In a case that the voltage applied to the first modulation gate is higher than the voltage applied to the second modulation gate, the signal charges stored in the semiconductor region move from a side where the second modulation gate is located to a side where the first modulation gate is located. It should be noted that, in a process that the signal charges move via a buried layer from the side where the second modulation electrode is located to the side where the first modulation gate is located, a small part of the signal charges move inside the first modulation gate. When no voltage is applied to the first modulation gate or the voltage applied to the first modulation gate is lower than the voltage applied to the second modulation gate, the signal charges moving inside the first modulation gate move back to the semiconductor region from the first modulation gate. In order to reduce an effect of this phenomenon on an accuracy of a next signal charge output, the voltage of the first storage region is set to be higher than the voltage of the first modulation gate when directly connecting the first storage region to the first modulation gate and setting a negative voltage for the first modulation gate, so that the first storage region attracts the signal charges remained in the first modulation gate, preventing the signal charges remained in the first modulation gate from being transferred back to the semiconductor region, thereby ensuring the accuracy of the next signal charge output. Similarly, the signal charges moving inside the second modulation gate may move out of the second modulation gate to the semiconductor region. In order to reduce the effect of this phenomenon on the accuracy of the next signal charge output, the voltage of the second storage region is set to be higher than the voltage of the second modulation gate when directly connecting the second storage region to the second modulation gate and setting a negative voltage for the second modulation gate, so that the second storage region attracts the signal charges remained in the second modulation gate.

In this embodiment, the semiconductor element includes: a first modulation gate group, a second modulation gate group, a semiconductor region, a first storage region, and a second storage region. The first modulation gate group includes at least two first modulation gates, and the second modulation gate group includes at least two second modulation gates. The first modulation gate group and the second modulation gate group are respectively arranged on two sides of the semiconductor region. Different voltages are respectively applied to the first modulation gate group and the second modulation gate group, to change an electric potential of a signal charge transfer path in the semiconductor region and control signal charges to move in a second direction in a range of a first direction, where the second direction includes a movement direction of the signal charges in the semiconductor region, and the first direction is perpendicular to the second direction. The range of the first direction includes: a range of a distance between the first modulation gates in the first direction, or a range of a distance between the second modulation gates in the first direction. The first storage region is directly connected to the first modulation gate, so that in a case that a voltage of the first storage region is higher than the voltage of the first modulation gate, the first storage region attracts first signal charges remained in the first modulation gate. The second storage region is directly connected to the second modulation gate, so that in a case that a voltage of the second storage region is higher than the voltage of the second modulation gate, the second storage region attracts second signal charges remained in the second modulation gate. The signal charges include at least the first signal charges and the second signal charges. By directly connecting the second storage region with the second modulation gate and directly connecting the first storage region with the first modulation gate, the first signal charges remained in the first modulation gate can be attracted by the first storage region, the second signal charges remained in the second modulation gate can be attracted by the second storage region, preventing the signal charges remained in the first modulation gate or the second modulation gate from being transferred back to the semiconductor region, thereby improving the accuracy of the next signal charge output.

Further, based on the above embodiments, the method further includes:
 arranging the first storage region between the adjacent first modulation gates; and/or
 arranging the second storage region between the adjacent second modulation gates.

In this embodiment, by arranging the first storage region between the adjacent first modulation gates, a contact region between the first modulation gate and the first storage region is increased, improving an efficiency of the first storage region in attracting the first signal charges remained in the first modulation gate. Further, by arranging the second storage region between the adjacent second modulation gates, a contact region between the first modulation gate and the first storage region is increased, improving an efficiency of the second storage region in attracting the second signal charges remained in the second modulation gate. In this way, the first signal charges and the second signal charges can be prevented from flowing back to the semiconductor region.

Further, based on the above embodiments, the semiconductor region includes a buried layer formed by a first type of conductive material, and the method further includes:
 arranging the buried layer on a substrate, where the substrate is formed by a second type conductive material;
 along a first direction, arranging a first buffer region in a region of the buried layer close to the first modulation gate, where the first buffer region is formed by the first type of conductive material, and the first direction is perpendicular to the second direction, and a concentration of the first type of conductive material in the first buffer region is greater than a concentration of the first type of conductive material in the buried layer; and
 along the first direction, arranging a second buffer region 204 in a region of the buried layer close to the second modulation gate, where the second buffer region is formed by the first type of conductive material, and a concentration of the first type of conductive material in the second buffer region is greater than the concentration of the first type of conductive material in the buried layer.

Further, based on the above embodiments, the method further includes:
 along the first direction, arranging a first sub storage region 231 on a side of the first modulation gate far away from the semiconductor region, and arranging a first isolation region 223 between the first buffer region and the first sub storage region, where the first storage region includes the first sub storage region; and
 along the first direction, arranging a second sub storage region on a side of the second modulation gate far away from the semiconductor region, and arranging a second isolation region between the second buffer region and the second sub storage region, where the second storage region includes the second sub storage region.

Further, based on the above embodiments, the method further includes:
 along the second direction, arranging a first switch and a first output region sequentially on a side of the first storage region far away from the semiconductor region, where the first storage region is arranged on a side of the buried layer close to the first switch, the first storage region is spaced apart from the first output region by a preset distance, the first storage region is formed by the first type of conductive material, and in a case that the first switch is turned on, the signal charges are outputted via the first output region; and
 along the second direction, arranging a second switch and a second output region sequentially on a side of the second storage region far away from the semiconductor region, where the second storage region is arranged on a side of the buried layer close to the second switch, the first storage region is spaced apart from the first output region by a preset distance, the first storage region is formed by the first type of conductive material, and in a case that the first switch is turned on, the signal charges are outputted via the first output region.

Further, based on the above embodiments, the method further includes:

arranging a third switch and a fourth switch respectively on two sides of the semiconductor region along the first direction, to output non-signal charges, where the non-signal charges include charges that are not the signal charges.

Further, based on the above embodiments, the method further includes:

arranging at least one third modulation gate group between the first modulation gate group and the second modulation gate group, where the third modulation gate group includes at least two third modulation gates respectively arranged adjacent to each other.

The working principle and the technical effect of the semiconductor element manufactured by the above method are respectively similar to those of the semiconductor element shown in FIGS. 1 to 5, which are not repeated herein. For example, in the process of manufacturing the semiconductor element, the first modulation gate, the second modulation gate, the first switch, the second switch, the third switch, and the fourth switch may be formed at the same time. That is, the first modulation gate, the second modulation gate, the first switch, the second switch, the third switch and the fourth switch are simultaneously formed after the first storage region and the second storage are formed.

It should be noted that, the pinned layer 202, the pinned layer 310 and the pinned layer 401 in the above embodiments are the same pinned layer, and the buried layer 201, the buried layer 311 and the buried layer 411 in the above embodiments are the same buried layer.

It should further be noted that, technical features described in the above embodiments can be combined in any suitable manner in the absence of contradiction. Further, different implementations in the present disclosure can be combined in any manner without departing from the idea of the present disclosure. These combinations should be regarded as contents disclosed in the present disclosure. The present disclosure is not limited to structures described above. The scope of the present disclosure is only defined by the appended claims.

The invention claimed is:

1. A semiconductor element, comprising:
a first modulation gate group, comprising at least two first modulation gates;
a second modulation gate group, comprising at least two second modulation gates;
a semiconductor region;
a first storage region; and
a second storage region, wherein
the first modulation gate group and the second modulation gate group are respectively arranged on two sides of the semiconductor region, so that in a case that a voltage applied to the first modulation gate group is different from a voltage applied to the second modulation gate group, electric potentials of the two sides of the semiconductor region are changed and signal charges are controlled to move in a second direction, wherein the second direction comprises a movement direction of the signal charges in the semiconductor region;
the first storage region is directly connected to each of the first modulation gates, so that in a case that a voltage of the first storage region is higher than the voltage of the first modulation gate, first signal charges remained in the first modulation gate are attracted to the first storage region and are stored in the first storage region; and
the second storage region is directly connected to each of the second modulation gates, so that in a case that a voltage of the second storage region is higher than the voltage of the second modulation gate, second signal charges remained in the second modulation gate are attracted to the second storage region and are stored in the second storage region.

2. The semiconductor element according to claim 1, wherein
the first storage region is arranged between adjacent first modulation gates; and/or
the second storage region is arranged between adjacent second modulation gates.

3. The semiconductor element according to claim 2, wherein
the semiconductor region comprises a buried layer, and the buried layer is formed by a first type of conductive material;
the buried layer is formed on an epitaxial layer, and the epitaxial layer is formed by a second type of conductive material;
along a first direction, a first buffer region is provided in a region of the buried layer close to the first modulation gate, the first buffer region is formed by the first type of conductive material, and the first direction is perpendicular to the second direction, and a concentration of the first type of conductive material in the first buffer region is greater than a concentration of the first type of conductive material in the buried layer; and
along the first direction, a second buffer region is provided in a region of the buried layer close to the second modulation gate, the second buffer region is formed by the first type of conductive material, and a concentration of the first type of conductive material in the second buffer region is greater than the concentration of the first type of conductive material in the buried layer.

4. The semiconductor element according to claim 3, further comprising:
a first sub storage region; and
a second sub storage region, wherein
along the first direction, the first sub storage region is arranged on a side of the first modulation gate far away from the semiconductor region, a first isolation region is provided between the first buffer region and the first sub storage region, and the first storage region comprises the first sub storage region; and
along the first direction, the second sub storage region is arranged on a side of the second modulation gate far away from the semiconductor region, a second isolation region is provided between the second buffer region and the second sub storage region, and the second storage region comprises the second sub storage region.

5. The semiconductor element according to claim 2, further comprising:
a first output region;
a first switch;
a second output region; and
a second switch, wherein
along the second direction, the first switch and the first output region are sequentially arranged on a side of the first storage region far away from the semiconductor region, the first storage region is spaced apart from the first output region by a preset distance, the first storage region is formed by the first type of conductive material, and in a case that the first switch is turned on, the signal charges are outputted via the first output region; and along the second direction, the second switch and the second output region are sequentially arranged on a side of the second storage region far away from the semiconductor region, the second storage region is spaced apart from the second output region by a preset distance, the second storage region is formed by the first type of conductive material, and in a case that the second switch is turned on, the signal charges are outputted via the second output region.

6. The semiconductor element according to claim 3, further comprising:
a third switch;
a third output region;
a fourth switch; and
a fourth output region, wherein
the third output region and the fourth output region are respectively arranged on two sides of the semiconductor region along the first direction, and the third switch is arranged between the semiconductor region and the third output region, the fourth switch is arranged between the semiconductor region and the fourth output region;
in a case that the third switch is turned on, non-signal charges are outputted via the third output region; and
in a case that the fourth switch is turned on, non-signal charges are outputted via the fourth output region, wherein the non-signal charges comprise charges that are not the signal charges in the semiconductor region.

7. The semiconductor element according to claim 6, further comprising:
at least one third modulation gate group, wherein
the third modulation gate group comprises at least two third modulation gates; and
the third modulation gate group is arranged between the first modulation gate group and the second modulation gate group.

8. A solid-state imaging device, comprising:
the semiconductor element according to claim 1, wherein the signal charges comprise charges converted by a signal light.

9. A method for manufacturing a semiconductor element, the method comprising:
arranging a first modulation gate group and a second modulation gate group respectively on two sides of a semiconductor region, so that in a case that a voltage applied to the first modulation gate group is different from a voltage applied to the second modulation gate group, an electric potential of a signal charge transfer path in the semiconductor region is changed and signal charges are controlled to move in a second direction, wherein the second direction comprises a movement direction of the signal charges in the semiconductor region;
connecting a first storage region directly to a first modulation gate, so that in a case that a voltage of the first storage region is higher than a voltage of the first modulation gate, the first storage region attracts first signal charges remained in the first modulation gate; and
connecting a second storage region directly to a second modulation gate, so that in a case that a voltage of the second storage region is higher than the voltage of the second modulation gate, the second storage region attracts second signal charges remained in the second modulation gate.

10. The method according to claim 9, further comprising:
arranging the first storage region between adjacent first modulation gates; and/or
arranging the second storage region between adjacent second modulation gates.

11. The method according to claim 10, wherein the semiconductor region comprises a buried layer formed by a first type of conductive material, and the method further comprises:
arranging the buried layer on a substrate, wherein the substrate is formed by a second type of conductive material;
along a first direction, arranging a first buffer region in a region of the buried layer close to the first modulation gate, wherein the first buffer region is formed by the first type of conductive material, and the first direction is perpendicular to the second direction, and a concentration of the first type of conductive material in the first buffer region is greater than a concentration of the first type of conductive material in the buried layer; and
along the first direction, arranging a second buffer region in a region of the buried layer close to the second modulation gate, wherein the second buffer region is formed by the first type of conductive material, and a concentration of the first type of conductive material in the second buffer region is greater than the concentration of the first type of conductive material in the buried layer.

12. The method according to claim 11, further comprising:
along the first direction, arranging a first sub storage region on a side of the first modulation gate far away from the semiconductor region, and arranging a first isolation region between the first buffer region and the first sub storage region, wherein the first storage region comprises the first sub storage region; and
along the first direction, arranging a second sub storage region on a side of the second modulation gate far away from the semiconductor region, and arranging a second isolation region between the second buffer region and the second sub storage region, wherein the second storage region comprises the second sub storage region.

13. The method according to claim 12, further comprising:
along the second direction, arranging a first switch and a first output region sequentially on a side of the first storage region far away from the semiconductor region, wherein the first storage region is arranged on a side of the buried layer close to the first switch, the first storage region is spaced apart from the first output region by a preset distance, the first storage region is formed by the first type of conductive material, and in a case that the first switch is turned on, the signal charges are outputted via the first output region; and
along the second direction, arranging a second switch and a second output region sequentially on a side of the second storage region far away from the semiconductor region, wherein the second storage region is arranged on a side of the buried layer close to the second switch, the first storage region is spaced apart from the first output region by a preset distance, the first storage region is formed by the first type of conductive material, and in a case that the first switch is turned on, the signal charges are outputted via the first output region.

14. The method according to claim 9, further comprising:
arranging a third switch and a fourth switch respectively on two sides of the semiconductor region along the first direction, to output non-signal charges, wherein the non-signal charges comprise charges that are not the signal charges.

15. The method according to claim 14, further comprising:
arranging at least one third modulation gate group between the first modulation gate group and the second modulation gate group, wherein the third modulation gate group comprises at least two third modulation gates respectively arranged adjacent to each other.

* * * * *